United States Patent [19]

Bartha et al.

[11] Patent Number: 5,658,472

[45] Date of Patent: Aug. 19, 1997

[54] METHOD FOR PRODUCING DEEP VERTICAL STRUCTURES IN SILICON SUBSTRATES

[75] Inventors: Johann Bartha, Aidlingen; Johann Greschner, Pliezhausen; Robert Junginger, Boblingen; Georg Kraus, Wildberg, all of Germany

[73] Assignee: International Business Machines Corporation, Armonk, N.Y.

[21] Appl. No.: 477,059

[22] Filed: Jun. 7, 1995

[30] Foreign Application Priority Data

Feb. 24, 1995 [DE] Germany ............. 95102638.4

[51] Int. Cl.$^6$ ................................ H01L 21/82
[52] U.S. Cl. .................. 216/2; 216/79; 216/46; 438/700; 438/696; 438/719
[58] Field of Search .............. 437/228; 156/662.1, 156/651.1, 653.1; 216/46, 79

[56] References Cited

U.S. PATENT DOCUMENTS

| 4,472,240 | 9/1984 | Kameyama ............... 156/648 |
| 5,194,118 | 3/1993 | Shinohara ............... 156/643 |
| 5,501,893 | 3/1996 | Laermer et al. ............. 216/67 |

FOREIGN PATENT DOCUMENTS

| 0366882A2 | 2/1989 | European Pat. Off. . |
| 60-154622 | 8/1985 | Japan . |
| 02098925 | 4/1990 | Japan . |
| WO94/14187 | 6/1994 | WIPO . |

OTHER PUBLICATIONS

Kenji Murakami, Yuji Wakabayashi, Kazuyuki Minami, Masayoshi Esashi, Crypgenic Dry Etching for High Aspect Ratio Microstructures, Jul. 2, 1993, pp. 65–70.

Technical Disclosure Bulletin, Silicon Trench Formation Using Alternative Reactive Ion Etch And Oxidation, vol. 33, No. 2, p.351 (Jul. 1990).

Christopher D'Emic, Kevin Chan, Joseph Blum, Deep Trench Plasam Etching of Single Crystal Silicon Using $SF_6/O_2$, Jrnal of Vac. Science &Technology B 10(1992)May/Jun., No.3, New York, US, pp. 1105–1110.

T. Kure, Y. Gotoh, H. Kawakami, S. Tachi, Highly Anisotropic Microwave Plasma Etching For High Packing Density Silicon Patterns, Feb. 6, 1992, pp. 48–49.

"Reactive Ion Etching of Deep Isolation Trenches Using Sulfur Hexafluoride, Chlorine, Helium, and Oxygen"; Proc. SPIE–Int. Opt. Eng. (USA); vol. 1392; 1991; Krawiez et al.; abstract only.

Primary Examiner—R. Bruce Breneman
Assistant Examiner—George Goudreau
Attorney, Agent, or Firm—Ira D. Blecker

[57] ABSTRACT

A method is provided for producing deep substantially vertical structures in silicon substrates, wherein in a first step, the silicon substrate is anisotropically plasma etched to a first predetermined depth, thereby creating a first structure. Subsequently, the surface of the substrate is covered conformally with an etch-resistant coating, and the horizontal parts of said coating are selectively removed. Following this removal, the substrate is anisotropically plasma etched at low temperatures to a second predetermined depth with a mixture of $SF_6/O_2$, whereby a second structure is created. Finally, the vertical parts of the coating are removed.

18 Claims, 3 Drawing Sheets

METHOD FOR PRODUCING DEEP VERTICAL STRUCTURES IN SILICON SUBSTRATES

FIELD OF THE INVENTION

The present invention relates to anisotropic etching in silicon substrates and especially to a method for producing deep substantially vertical structures in silicon substrates at low temperatures.

BACKGROUND OF THE INVENTION

Anisotropic etching in silicon requires gas mixtures which are able to cause an "in-situ" passivation of the side walls of the structure to be etched. The process parameters are adjusted so that, e.g., carbon containing polymers will form on the sidewall of the structure (of. P. H. Singer, "Today's Plasma Etch Chemistries", Semiconductor International, vol. 11, no. 4, p. 68 (1988)).

For the manufacture of the so called "deep capacitor trenches", Y. T. Lii et al., Electrochem. Soc. Proc., Vol. 92–1, p. 158 ff., as well as J. A. Bondur et al., Electrochem. Soc. Proc., Vol. 90–1, p. 176 ff., use gas mixtures which comprise HBr, He/$O_2$ or $NF_3$. Typical etch rates (in RF plasmas) are 0.1 µm/min to a maximum of 0.7 µm/min and typical etch depths amount to a maximum of 20 µm. However, for the manufacture of micromechanical structures, substantially higher etch rates have to be achieved. Using $SF_6$ in combination with compact microwave- or helicon plasmas, etch rates up to 10 times greater can be realized.

Lower temperature or cryogenic etching has been shown to improve etch anisotropy (cf. W. Varthue et al., "Electron Cyclotron Resonance Plasma Etching of Photoresist at Cryogenic Temperatures", J. Appl. Phys., vol. 72, no. 7, p. 3050 (1992)). This result is thought to occur because spontaneous sidewall reactions are reduced at lower temperatures. The reduced spontaneous reaction rate reduces the etching of the sidewalls.

However, for very great etch depths, sharp anisotropic etch profiles and, simultaneously, high etch rates can not be achieved by simply etching at cryogenic temperatures. When etching to great depths, typically greater than 50 µm, the side wall passivation in the area of the surface of the etched structure will, in turn, be destroyed and an isotropic profile showing a partially destroyed side wall results (1 in FIG. 1, FIG. 2).

It is therefore an object of the present invention to provide a cost-effective and reliable method for producing deep substantially vertical structures in silicon substrates.

It is a further object of the invention that these structures can be produced at high etch rates thereby showing substantially anisotropic profiles.

BRIEF SUMMARY OF THE INVENTION

These objects are achieved by a process comprising the steps of:

a) anisotropically plasma etching a portion of the silicon substrate to a first predetermined depth thereby creating a first structure, b) conformally coating the surface of said silicon substrate and said anisotropically etched portion with an etch-resistant coating, c) selectively removing the horizontal parts of said coating, d) anisotropically plasma etching said anisotropically etched portion of said silicon substrate at low temperatures to a second predetermined depth with a mixture of $SF_6/O_2$, and e) removing the vertical parts of said coating, thereby forming a deep substantially vertical structure.

By means of this process, the area of the sidewalls lying near the surface of the substrate is, in addition to the insufficient "in-situ"-coating, protected by a specific protective coating.

The sidewall passivation thus is sufficient to protect the pre-etehed structure so that the sidewalls are not destroyed when the substrate is further etched.

It was found that adding $O_2$ to the $SF_6$ gas at low temperatures results in creating substantially anisotropic profiles in the substrates.

These and other objects, features and advantages will become apparent from the following detailed description of the various aspects of the invention taken in conjunction with the accompanying drawings.

DETAILED DESCRIPTION OF THE INVENTION

Figure 1:
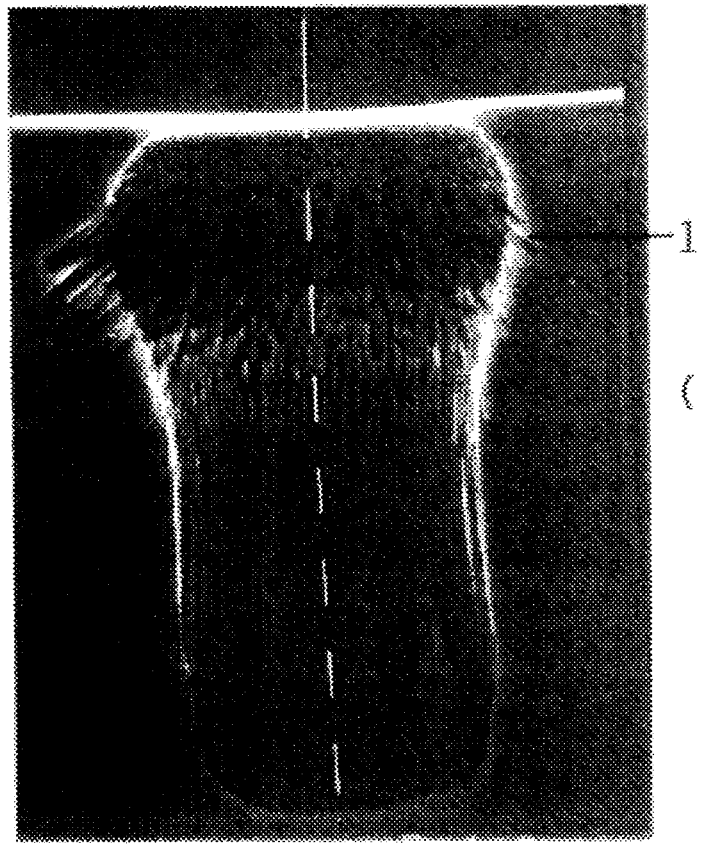
FIG. 1 depicts an SEM cross-section of an unprotected silicon trench etched according to a prior art process.
Figure 2:
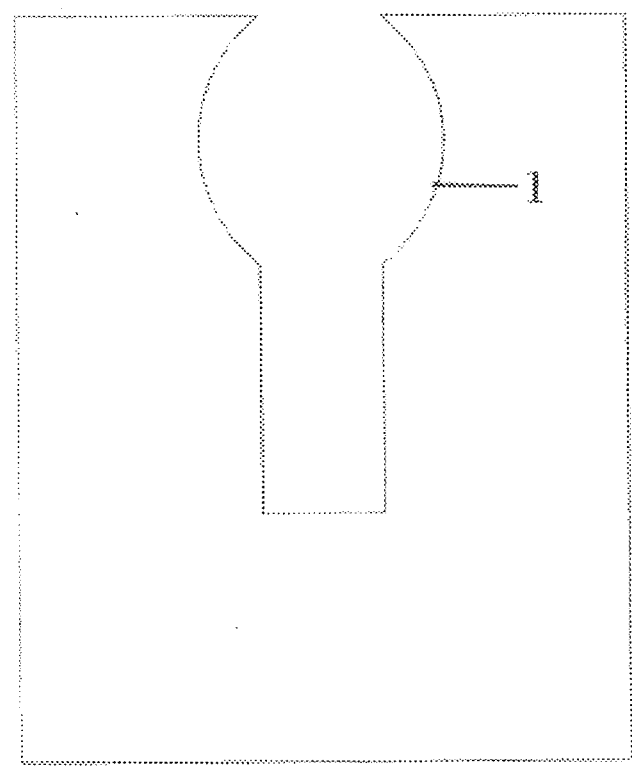
FIG. 2 shows schematically a destroyed side wall passivation in the area near the surface of the etched structure according to a prior art process.
Figure 3A:
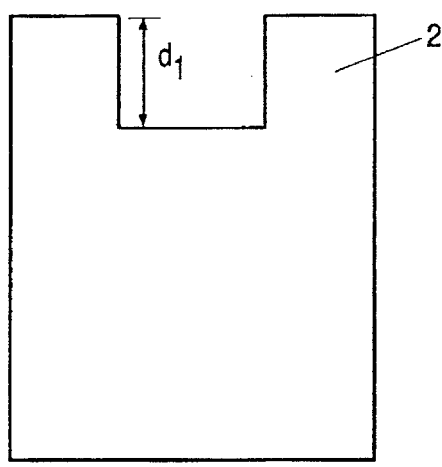
FIGS. 3a–3e shows the process flow of the method according to the invention.
Figure 3D:
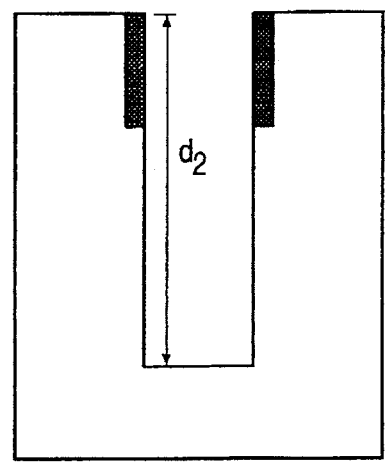
Figure 3B:
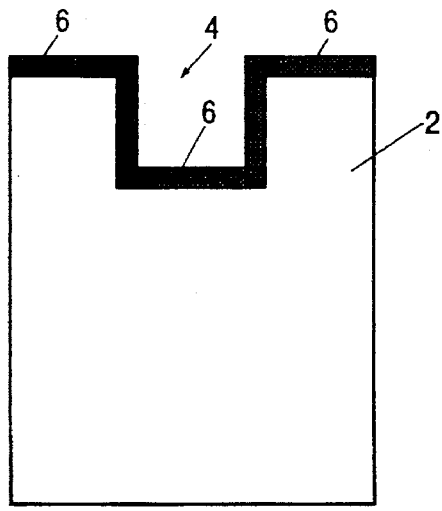
Figure 3E:
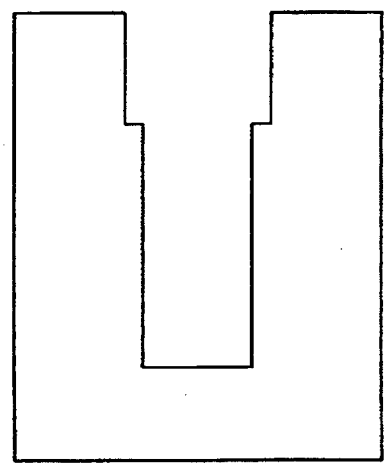
Figure 3C:
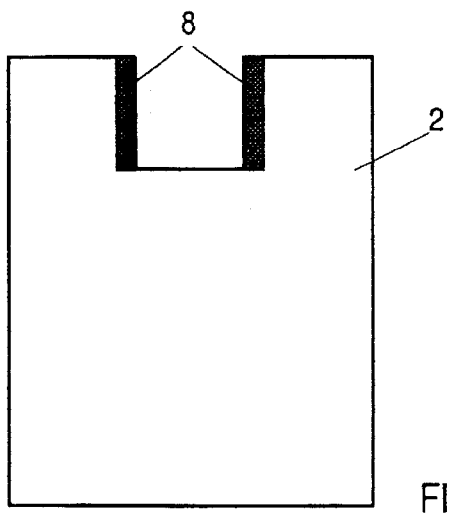

The process sequence for the method according to the invention is schematically shown in FIG. 3. According to FIG. 3a), the substrate 2 is first of all etched anisotropically, e.g. by RIE (reactive ion etching) or by using a gas mixture of $SF_6/O_2$ through a first etch mask (not shown) to a first predetermined depth $d_1$ by means of an anisotropic etch step. $SiO_2$ as an etch mask material was found to be advantageous. Thus a first structure is created. The value of this first predetermined etch depth depends on the desired overall depth of the fully etched structure. It is in the range of about 10 to about 50 micrometer, preferably about 40 micrometer. For this first etching step all suitable etchants could be used and the etching can take place either at room temperature or at lower temperatures. It has, however, been found that a mixture of $SF_6$ and $O_2$, especially at low temperature is advantageous.

When the first depth $d_1$ has been reached, the etching is stopped and the substrate 2 is conformally coated with an etch-resistant coating 4 (FIG. 3b)). This coating can, e.g., be made of thermal oxide. In this case the substrate has to be removed from the etching reactor and is coated with $SiO_2$ or other suitable thermal oxide in a separate deposition chamber. After deposition, the substrate is again entered into the etching reactor and the horizontal parts 6 of the oxide coating are removed by an anisotropic etch step, e.g., using argon. This anisotropic etch step is preferably performed with an argon flow of 200 sccm at 0.4 Pa and −200 V DC-bias.

After this etch step has been performed, only the vertical parts 8 of the coating will remain (FIG. 3c)).

In the next step, the silicon will be etched with a gas mixture of $SF_6$ and $O_2$ at low temperatures (using the first etch mask) until a second predetermined etch depth $d_2$ is reached (FIG. 3d)). Thus a second structure is created. The value of this second predetermined etch depth is in the range of about 30 to about 90 micrometers, preferably about 50 micrometers. In this context, low temperatures shall mean such temperatures where acceptable high etch rates, i.e. in the range of 2-6 µm/min can be expected. It was found that the temperature should be in the range of about −80° C. to −120° C. and preferably is −100° C.

After removal of the remaining protective coating 8 (and the remaining mask), e.g., by etching with a suitable etchant, the desired profile is achieved (FIG. 3e)).

The steps as shown in FIGS. 3a-3e may be repeated as necessary to achieve the desired structure.

As already mentioned above, when using thermal oxide as a protective coating, the substrate has to be removed from the etch reactor to be able to deposit the oxide in a separate deposition chamber.

In an especially advantageous embodiment of the present invention, the protective coating is therefore formed of an ice film. In this case, the substrate can be left in the etch reactor when applying the protective coating. This can be realized by the following process steps:

In the first step, the substrate is anisotropically etched to the first predetermined depth $d_1$. This can be achieved by RIE etching or by using a gas mixture of about 5 to 30% $O_2$ and about 95 to 70% $SF_6$. In an especially advantageous embodiment a gas mixture of 20% $O_2$ and 80% $SF_6$ is used. The addition of a small amount of $O_2$ to $SF_6$ at low temperatures has been shown to further improve etch anisotropy. The substrate is preferably etched for a time of about 10 minutes applying a microwave power of about 1500 W, and a substrate bias of about −25 V at a pressure of about 1 Pa. In this case the etching was performed at −100° C., a suitable temperature range is about −80° C. to about −120° C. After the etching has been completed, the plasma is switched off and the reactor is pumped down to a basis vacuum of about $10^{-3}$ Pa.

Figure 5:
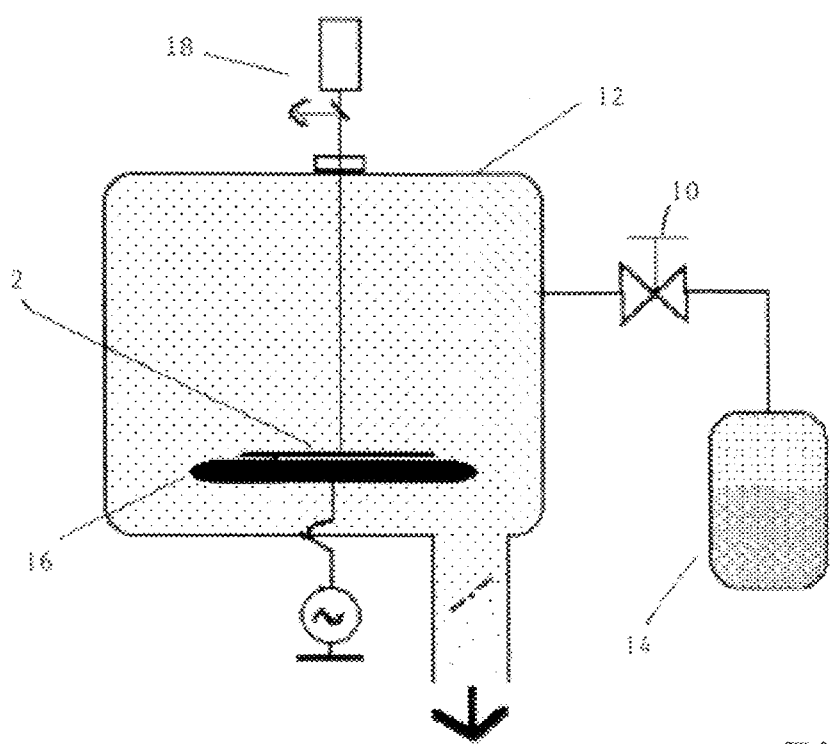
FIG. 5 shows an arrangement for coating the substrate at low temperatures according to a special embodiment of the invention.

In a second step, water vapor is condensed on the so structured surface of the substrate. FIG. 5 schematically shows a respective arrangement. In case the first etching step was performed at room temperature, the substrate has first to be cooled down to the condensation temperature. By means of a metering valve 10 water vapor is introduced into the reaction chamber 12 from a little vacuum vessel 14 filled with water. The water vapor condenses on the cooled substrate supported by a susceptor 16 and forms an ice film on the surface of the first structure produced during the first etching step. For this step a water partial pressure of about 0.1–0.5 Pa has turned out to be suitable. Within a few minutes a substantially isotropic ice film having a thickness of a few micrometers is formed on the substrate. The formation of this film can be controlled "in-situ" by means of an interferometer 18. A film thickness on the horizontal parts of the coating of between 1 and 1.5 µm has proved to be appropriate. Since only half of the half-space at the sidewall is available for adsorption if a step is present in the substrate, the thickness of the ice film at the sidewall should be about half the thickness of the ice film on the horizontal parts of the coating. The sublimation rate at a temperature of about −100° C. is so small that the so formed ice film is stable over a longer period of time.

The third step of the method according to the invention comprises sputter etching the ice film with a suitable etchant, e.g., argon, on the horizontal parts of the substrate whereas the film will retain on the vertical parts due to the strong anisotropy of the etching step (FIG. 3c)). Suitable process parameters for this step are e.g., an argon gas flow of 20 sccm, a chamber pressure of 0.4 Pa, a microwave power of 1500 W and a DC-bias of −200 V. The end of the etching step can also be monitored by means of an interferometer 18.

Figure 4:
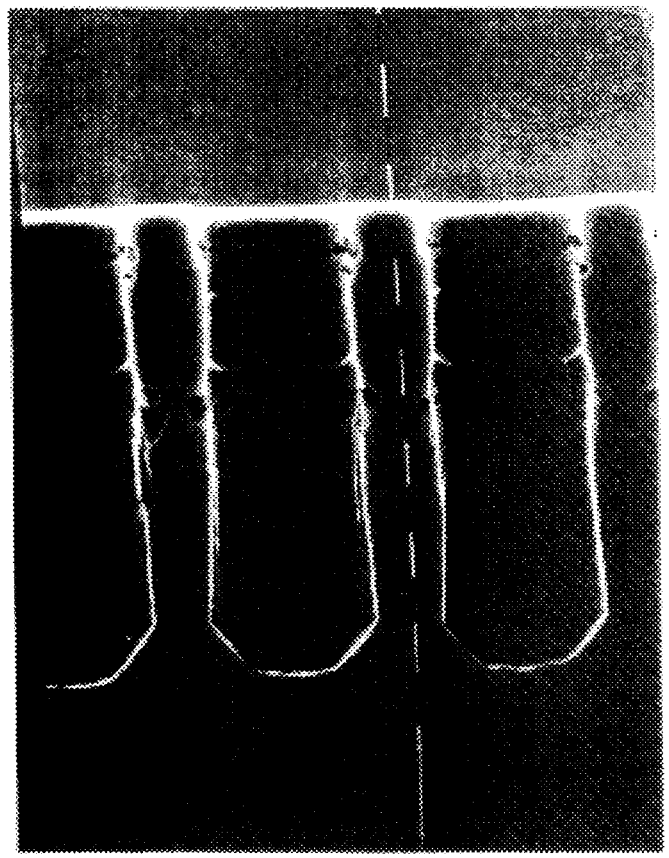
FIG. 4 depicts an SEM cross-section of a protected silicon trench etched according to the process of the invention.

Subsequently, the etching of the silicon is continued until the desired etch depth is achieved. After the etching at low temperature the substrate is brought to room temperature. The ice film acting as a passivation layer on the sidewall thereby evaporates without leaving any residue. The result of this process is shown in FIG. 4.

By means of the present invention, deep substantially vertical structures can be produced in silicon substrates using high etch rates.

The method according to the present invention is especially advantageous for the formation of guide plates, e.g., for use in test probes.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A method for producing deep substantially vertical structures in silicon substrates, comprising the steps of
   a) anisotropically plasma etching a portion of the silicon substrate to a first depth,
   b) conformally coating the surface of said silicon substrate and said anisotropically etched portion with an etch-resistant coating,
   c) selectively removing the horizontal parts of said coating,
   d) anisotropically plasma etching said anisotropically etched portion of said silicon substrate at low temperatures to a second depth with a mixture of $SF_6/O_2$, and
   e) removing the vertical parts of said coating, thereby forming a deep substantially vertical structure.

2. The method according to claim 1 wherein said mixture of $SF_6/O_2$ contains 5% to 30% $O_2$ and 95 to 70% $SF_6$, preferably 20% $O_2$ and 80% $SF_6$.

3. The method according to claim 1, wherein the temperature of the etching in step d) is in the range between −80° C. and −120° C., and especially is −100° C.

4. The method according to claim 1 wherein said etching in step a) is performed for 10 minutes using a microwave power of 1500 W, and a substrate bias of −25 V at a pressure of 1 Pa.

5. The method according to claim 1, wherein the etching in step a) is performed by RIE or by using a gas mixture of $SF_6/O_2$.

6. The method according to claim 1, wherein said etch-resistant coating consists of an ice film.

7. The method according to claim 1, wherein said etch-resistant coating is a thermal oxide coating.

8. The method according to claim 6, wherein the ice film is applied by condensing water vapor on the surface of the first structure.

9. The method according to claim 8, wherein the water partial pressure is between 0.1 and 0.5 Pa.

10. The method according to claim 6, wherein the horizontal parts of the ice film are removed by sputter etching with argon.

11. The method according to claim 1, wherein the step of conformally coating is controlled by means of an interferometer.

12. The method according to claim 10, wherein the step of removing is controlled my means of an interferometer.

13. The method according to claim 1, wherein the thickness of said coating on the horizontal parts of the substrate is between 1 and 1.5 micrometers and wherein the thickness of said coating on the vertical parts is half the thickness of said coating on the horizontal parts.

14. The method according to claim 10, wherein said sputter etching is performed with an argon flow of 20 sccm, a reactor pressure of 0.4 Pa, a microwave power of 1500 W and a DC-bias of −200 V.

15. The method according to claim 1, wherein the first depth is 10 to 50 μm, preferably 20 to 40 μm.

16. The method according to claim 1, wherein the second depth is about 30 to 90 μm, preferably 50 μm.

17. The method according to claim 1, wherein steps a) to e) are performed repeatedly.

18. The method according to claim 1, wherein said silicon substrate is a guide plate for a test probe.

* * * * *